(12) United States Patent
Layadi et al.

(10) Patent No.: US 6,821,886 B1
(45) Date of Patent: Nov. 23, 2004

(54) IMP TIN BARRIER METAL PROCESS (75) Inventors: Nace Layadi, Singapore (SG); Alvaro Maury, Singapore (SG); Jovin Lim, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/655,690

(22) Filed: Sep. 5, 2003

(51) Int. Cl.[7] .............................. H01L 21/44
(52) U.S. Cl. ............ 438/653; 438/644; 438/628; 257/751; 257/767
(58) Field of Search .................. 438/625–629, 438/643–645, 652–654; 257/751–753, 767

(56) References Cited

U.S. PATENT DOCUMENTS

| | | | |
|---|---|---|---|
| 6,043,148 A | 3/2000 | Peng et al. | 438/628 |
| 6,140,223 A | 10/2000 | Kim et al. | 438/629 |
| 6,214,742 B1 * | 4/2001 | Shields et al. | 438/720 |
| 6,297,555 B1 | 10/2001 | Zhao et al. | 257/758 |
| 6,326,690 B2 | 12/2001 | Wang et al. | 257/751 |
| 6,410,986 B1 * | 6/2002 | Merchant et al. | 257/763 |

* cited by examiner

*Primary Examiner*—Matthew Smith
*Assistant Examiner*—Calvin Lee
(74) *Attorney, Agent, or Firm*—George O. Saile; Rosemary L. S. Pike (57) ABSTRACT

A new method is provided for the creation of an adhesion/barrier layer over which a tungsten interconnect is created. The invention reduces metal extrusion and effects of pinholes by dividing the process of barrier material of TiN deposition into phases, whereby after about half the thickness of the required layer of TiN has been deposited, an intermediate and very thin layer of Ti is deposited. After the thin layer of Ti has been deposited, the deposition of the barrier layer of TiN is continued to the point where the required thickness for the layer of TiN has been reached.

45 Claims, 6 Drawing Sheets

IMP TIN BARRIER METAL PROCESS

BACKGROUND OF THE INVENTION

(1) Field of the Invention

The invention relates to the fabrication of integrated circuit devices, and more particularly, to a method for the creation of a barrier layer for a tungsten interconnect.

(2) Description of the Prior Art

Conventional methods of creating a tungsten interconnect, such as a tungsten plug in a via or contact, follows procedures of first creating an opening in a layer of dielectric by for instance plasma etching of the layer of dielectric, the removal of the via or contact exposure mask followed by a thorough surface clean, the deposition of an adhesion layer and a barrier layer preferably by methods of Physical Vapor Deposition (PVD) and a final step of tungsten deposition, preferably by Chemical Vapor Deposition (CVD).

Typically, Ti is used for the adhesion layer while TiN is used for the barrier layer. Tungsten is typically deposited using a tungsten hexafluoride ($WF_6$) gas. The barrier layer of TiN is deposited over a layer of Ti, the TiN barrier serves as a protective layer against the tungsten hexafluoride ($WF_6$) gas and the adhesion layer of Ti during tungsten deposition. The adhesion layer of Ti improves the adhesion of overlying metal films to the oxide of the surrounding dielectric of the via holes.

It is well known in the art that a layer of TiN that is deposited at low temperatures suffers from a relatively high resistivity, typically in excess of about 1,200 $\mu$m-cm. This high resistance is undesirable for obvious reasons of having a negative impact on device performance. Porosity and high oxygen content of the low-temperature created layer of TiN appear at this time to be the major contributors to the high resistance of the deposited layer of TiN.

Continuous reduction in device dimensions makes the creation of a conductive interconnect ever more challenging. Tungsten is frequently used for the creation of the conductive interconnect. The creation of high-performance semiconductor devices, with their inherent requirements of reduction of the dimensions of device features and the therefrom following increase in device density, lead to the creation of a relatively thicker layer of TiN as a barrier layer.

With increased thickness of the deposited layer of TiN, the temperature of the substrate increases during the deposition of the layer of TiN. If the relatively thick layer of TiN is deposited in one pass (one processing step), the temperature of the substrate may increase to the point where metal extrusion takes place. It is therefore desirable to provide a method whereby a relatively thick layer of barrier material can be created without suffering a negative impact of increasing temperatures of the substrate during barrier layer deposition.

U.S. Pat. No. 6,326,690 B2 (Wang et al.) shows a Ti/TiN stack process.

U.S. Pat. No. 6,297,555 B1 (Zhao et al.) shows a two-step TIN barrier process.

U.S. Pat. No. 6,043,148 (Peng et al.) reveals a TiN process.

U.S. Pat. No. 6,140,223 (Kim et al.) shows a multi-layer TiN barrier layer process.

SUMMARY OF THE INVENTION

A principal objective of the invention is to provide a method of creating a barrier layer for a tungsten interconnect.

Another objective of the invention is to provide a method for the creation of a barrier layer for a tungsten interconnect whereby effects of temperature increase are minimized.

Yet another objective of the invention is to provide a method for the creation of a barrier layer for a tungsten interconnect without introducing metal extrusion.

In accordance with the objectives of the invention a new method is provided for the creation of an adhesion/barrier layer over which a tungsten interconnect is created. The invention reduces metal extrusion and effects of pin-holes by dividing the process of barrier material of TiN deposition into two phases, whereby after about half the thickness of the required layer of TiN has been deposited, an intermediate and very thin layer of Ti is deposited. After the thin layer of Ti has been deposited, the deposition of the barrier layer of TiN is continued to the point where the required thickness for the layer of TiN has been reached.

BRIEF DESCRIPTION OF THE DRAWINGS

FIGS. 1 through 7 address a prior art method of creating a tungsten interconnect, as follows:

The process as described in FIGS. 1-6 suffers occasionally from marginality issues because the TiN ARC layer must be made thin to prevent excessive metal height. The via etch process is timed, resulting in inconsistency of the remaining TiN ARC after the via etch. In some cases this results in etching through the ARC layer of TiN and in "gauging" into the underlying aluminum (see FIG. 7).

The invention is described using FIGS. 8 through 14, as follows:

DESCRIPTION OF THE PREFERRED EMBODIMENTS

Conventional methods of creating an adhesion layer over which a barrier layer is created are first briefly highlighted, using FIGS. 1 through 7 for this purpose.

Figure 1:
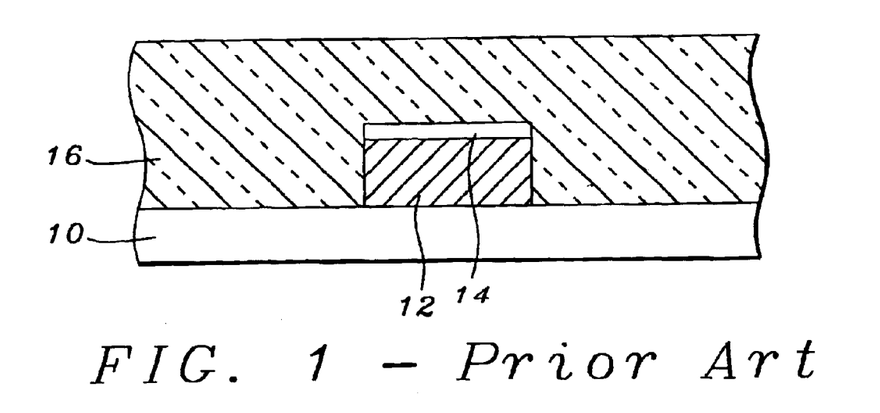
FIG. 1 shows a cross section of a substrate over the surface of which a patterned point of electrical contact has been created, a layer of ARC has been applied for the patterning of the electrical contact, a layer of dielectric has been deposited.

Shown in the cross section of FIG. 1 is the surface of a semiconductor substrate 10, a point of electrical contact 12 has been provided over the surface of substrate 10, the electrical contact 12 preferably comprising aluminum but not being limited to aluminum. An overlying and connecting contact plug comprising tungsten is to be created aligned with point 12 of electrical contact.

Figure 2:
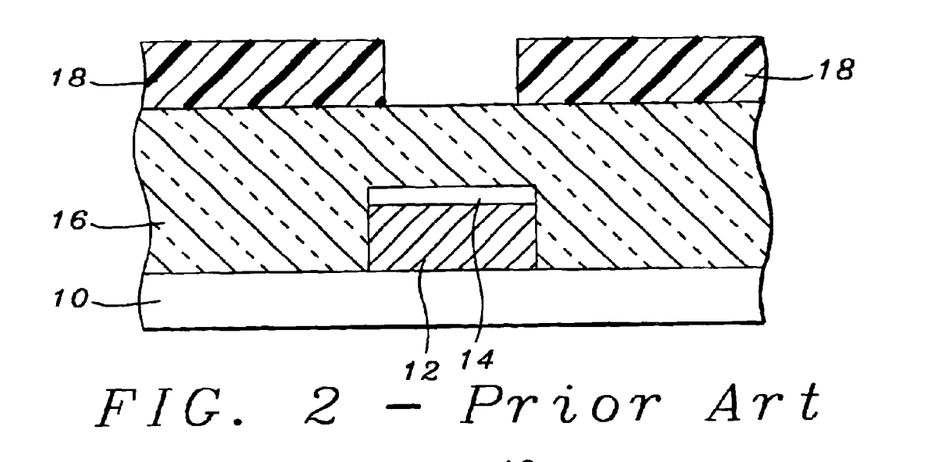
FIG. 2 shows a cross section after an etch blocking mask has been created over the layer of dielectric.

For this purpose, a (optional) layer 14 of Anti Reflective Coating (ARC) has been over the substrate 10 prior to the patterning of electrical contact point 12. A layer 16 of dielectric is deposited over the substrate 10 after the layers 14 of ARC and 12 of contact material (such as tungsten) have been patterned, creating the cross section of layers 14 and 12 that is shown in FIG. 2. The layer 14, of ARC is applied for conventional purposes of enhancing photolithographic exposure performance by enabling improved depth of focus.

An exposure blocking mask 18, FIG. 2, preferably comprising photoresist, is next created over the layer 16 of dielectric, applying conventional methods of photolithographic exposure and development.

Figure 3:
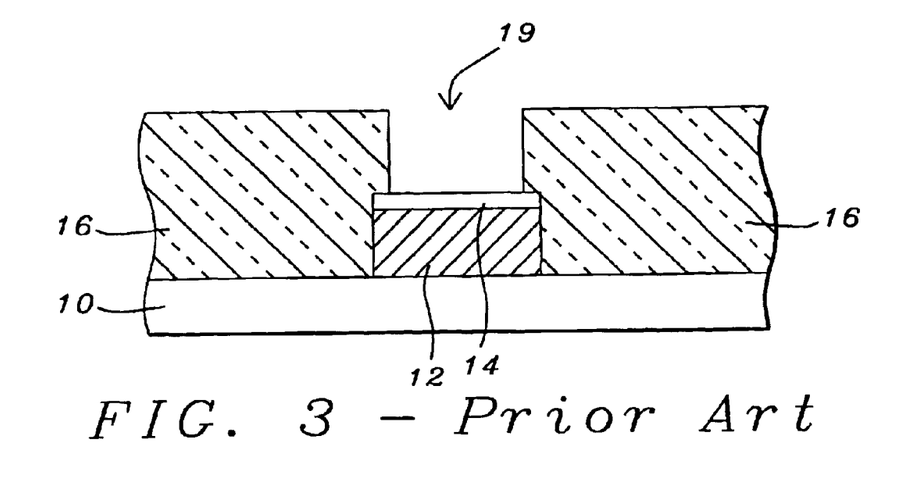
FIG. 3 shows a cross section after the layer of dielectric have been etched in accordance with the pattern of the etch blocking mask, the etch blocking mask has been removed.
Figure 4:
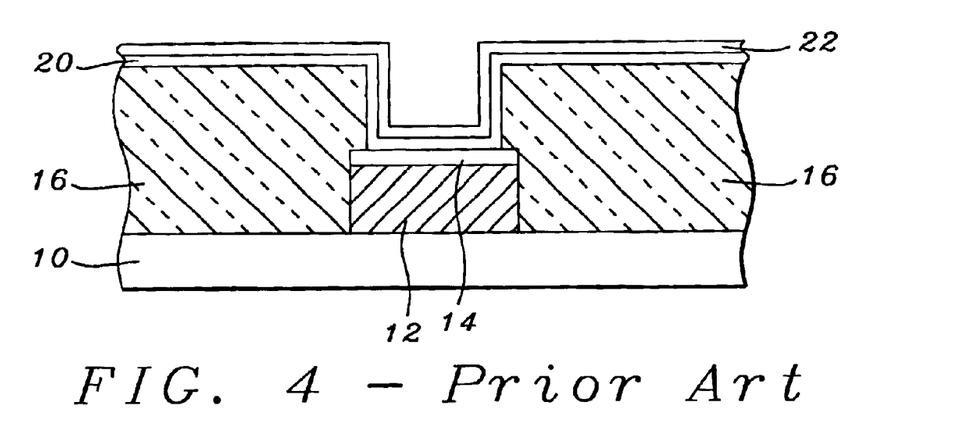
FIG. 4 shows a cross section after glue and barrier layers have been deposited.

FIG. 3 shows a cross section of the structure after the layer 16 of dielectric has been etched in accordance with the photoresist blocking mask 18, creating opening 19 through the layer 16 of dielectric and exposing the layer 14 of ARC overlying the aluminum contact point 12.

The structure shown in cross section in FIG. 3 is ready for the successive deposition of a layer 20, of adhesion material, preferably comprising Ti, and a layer 22, of barrier material, preferably comprising TiN, over the layer 16 and over inside surfaces of opening 19 created through the layer 16 of dielectric. The results of these depositions are shown in the cross section of FIG. 4, Layer 20 a Ti, is preferably created using methods of PVD, to a thickness between about 100 and 200 Angstroms, layer 22, of TiN, is also preferably created using methods of PVD, to a thickness between about 200 and 350 Angstroms.

Figure 5:
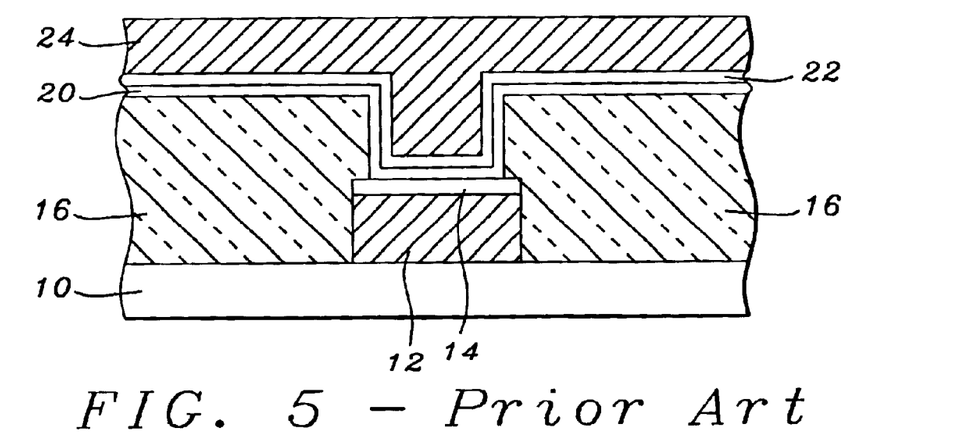
FIG. 5 shows a cross section after deposition of a layer of tungsten.

In FIG. 5 a layer 24 of metal, preferably comprising tungsten, is formed over the layer 22 of TiN.

Figure 6:
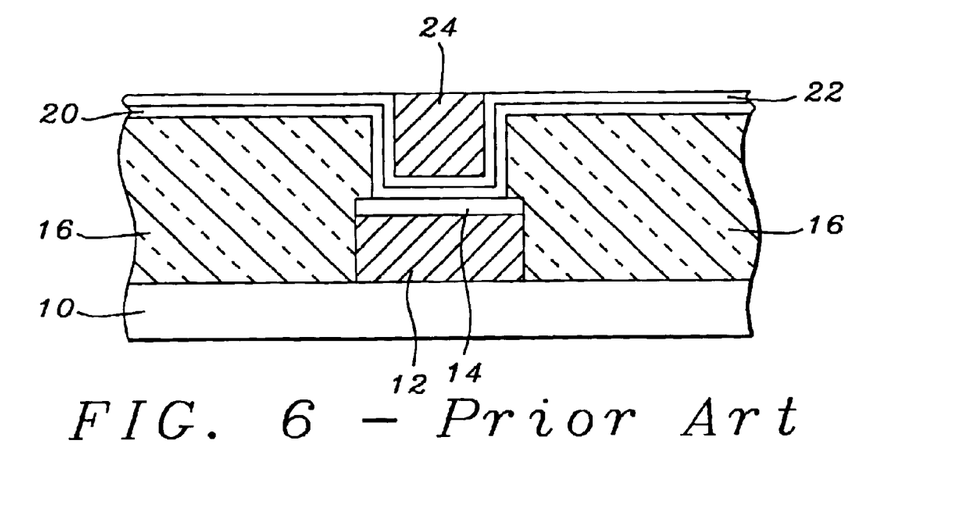
FIG. 6 shows a cross section after excess tungsten has been removed from the surface of the barrier layer.

In FIG. 6, the metal layer 24 has been removed from the surface of layer 22 to form the via interconnect 24. If tungsten is used to create the metal interconnect 24, excess tungsten is removed by CMP.

In the process that has been described above, if the TiN barrier 22 is formed to an increasing thickness, the thermal budget increases. As a consequence, metal extrusions are more readily formed due to the higher temperatures that are experienced during the deposition of the layer of TiN of increased thickness. As the integration of semiconductor devices increases, the problem of the occurrence of metal extrusions increases and becomes more serious.

In addition and as imperfections in the deposition uniformity of the deposited layer 22 of TiN, pin-holes tend to form in the deposited layer 22 of TiN, potentially causing the layer 20 of Ti to be attacked by the $WF_6$ gas used during tungsten deposition, resulting in other via related issues.

The above phenomena may result in an opening being created through the layer 22 of barrier material and the layer 20 of adhesion material. This opening through layers 22 and 20 exposes the layer 14 of ARC, which may now be affected to the point where an opening is in turn created through the layer 14 of ARC, this latter opening exposing the layer 12 of (for instance) aluminum. The exposed layer 12 of aluminum is as a result affected, resulting in reduced contact performance of the point 12 of electrical contact.

Figure 7:
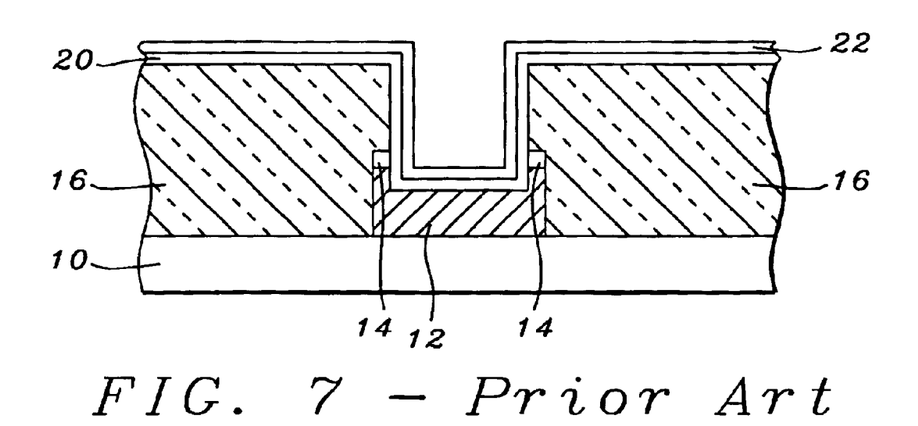
FIG. 7 shows the cross section of (the conventionally experienced problem of) etching through ("break-through") the layer of ARC.

The cumulative effect of chemical interactions of the above highlighted processing steps which potentially affect layers 22, 20 and 14, is shown in the cross section of FIG. 7. These interactions proceed, as shown in the cross section of FIG. 7, to the point where the underlying layer 12 of aluminum is affected, that is the surface of the layer 12 of aluminum is "gauged".

It must thereby be emphasized that, where the effect of gauging of the surface of layer 12 of aluminum is shown in FIG. 7 as being a well-defined profile having a square-shaped cross section, this gauging in reality is arbitrary in profile and may be approached in profile by a semi-elliptic form with a maximum depth of gauging in the center of opening 19.

The invention therefore provides a method that allows for the creation of a tungsten interconnect overlying a aluminum point of electrical contact whereby negative effects of gauging of the surface of the aluminum point of contact are minimized or eliminated.

The invention can be described by using FIGS. 1 through 3 as prior art that equally apply to the invention. These figures are therefore included herein at this time by reference, FIG. 3 has been re-created as FIG. 8 of the invention whereby FIG. 8 in addition shows the above explained effect of surface gauging of layer 12 of aluminum. Since FIGS. 1 through 3 and by reference thereto FIG. 8 have previously been highlighted, these figures do not need to be further addressed at this time.

Figure 8:
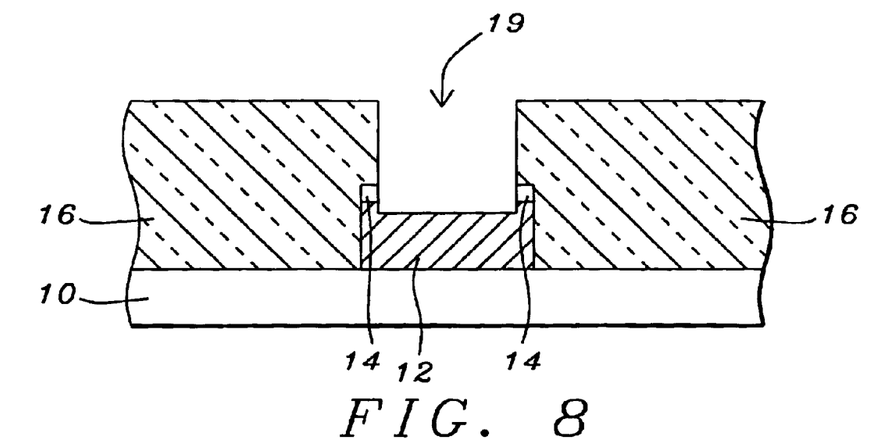
FIG. 8 shows a cross section cross section of a substrate over the surface of which a point of electrical contact has been provided, a layer of ARC has been provided for the patterning of the point of electrical contact, a patterned layer of dielectric has been created.

FIG. 8 shows a cross section of:
the surface of substrate 10
a patterned layer 12 of aluminum created over the substrate 10
a patterned layer 14 of ARC created over the patterned layer 12 of aluminum
a layer 16 of dielectric deposited over the substrate 10
an opening 19 created through a layer 16 of dielectric
the opening 19 extending through an underlying patterned layer 14 of ARC, and
the opening 19 extending into the surface of the patterned layer 12 of aluminum, this latter extending is the above referred to "gauging" of the surface of layer 12.

Figure 9:
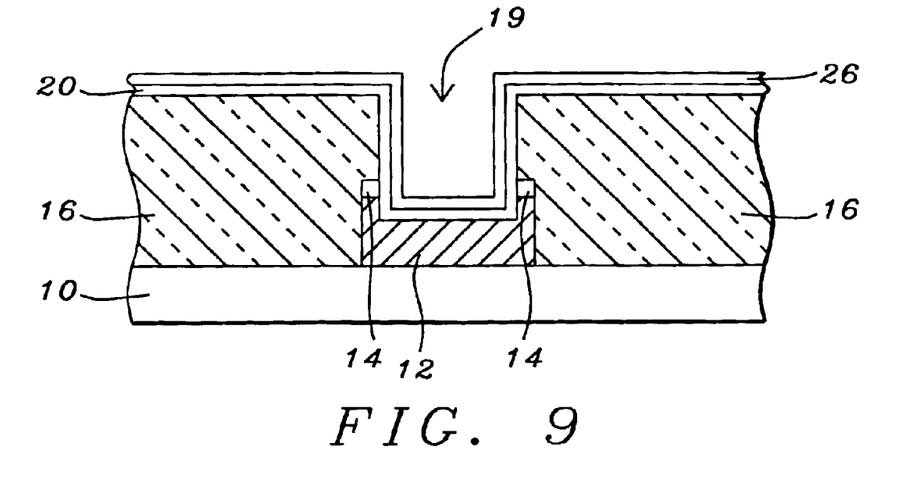
FIG. 9 shows a cross section after deposition of a layer of adhesion material after which a first layer of TiN has been deposited.

As a first step, FIG. 9, the invention creates a conventional adhesion/glue layer 20, preferably comprising Ti, over the surface of the layer 16 of dielectric and over inside surfaces of the opening 19 created through the layer 16 of dielectric, using methods of PVD and deposited to a preferred thickness of between about 100 and 200 Angstroms.

Next, as shown in cross section in FIG. 9, the invention starts depositing a required barrier layer of TiN by depositing a first or initial barrier layer 26 of TiN over layer 20 of Ti but interrupting this deposition of the layer of TiN before a required, final thickness of the barrier layer is obtained.

First or initial barrier layer 26, of TiN, preferably has a thickness that is about equal to half the thickness of a required barrier layer of TiN. It can be stated as a rough guide that the first deposition 26, FIG. 9, of TiN, is to be terminated at the time that the thickness of the deposited barrier layer 26 of TiN reaches between about 40 and 60% of the thickness of the required barrier layer of TiN. For instance, if the thickness of the required barrier layer of TiN is between about 200 and 350 Angstroms, then the thickness of the created layer 26 of TiN should be between about 100 and 175 Angstroms, with as a low limit of about 80 Angstrom and a high limit of about 210 Angstrom.

Figure 10:
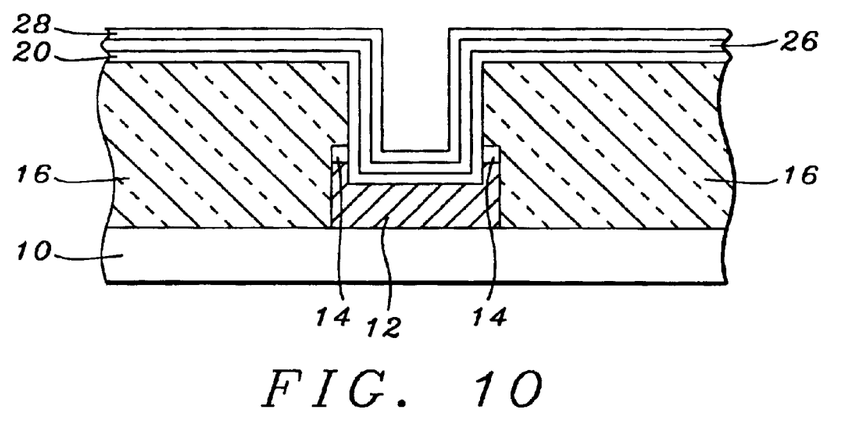
FIG. 10 shows a cross section after depositing of an ultra-thin layer of Ti.

After the first or initial barrier layer 26 of TiN has been deposited an ultra thin layer 28 of Ti is deposited over the layer 26 of TiN, as shown in the cross section of FIG. 10, using methods of PVD, deposited to a preferred thickness of between about 10 and 50 Angstroms.

Figure 11:
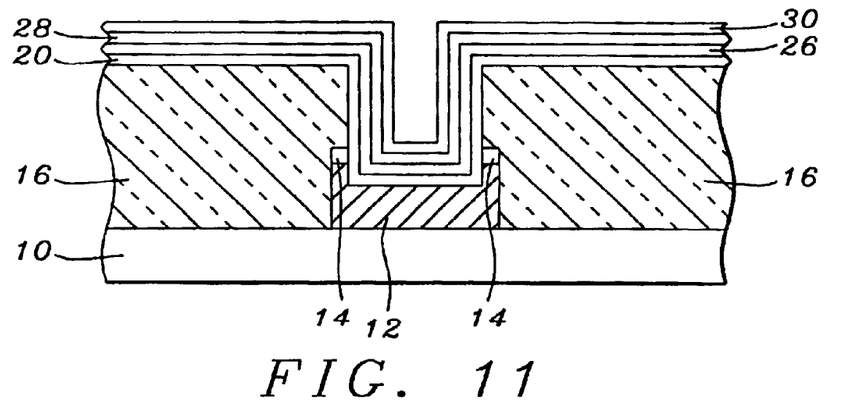
FIG. 11 shows a cross section after a second layer of TiN has been deposited.

After the ultra-thin layer 28 of Ti has been deposited, the creation of layer of barrier material comprising TiN is completed by a second or final depositing of layer 30 of TiN, FIG. 11, over the ultra-thin layer 28 of Ti. Layer 30 is deposited to a thickness that completes the required thickness of the barrier layer. For the above indicated preferred values of layer thickness, this results in a preferred thickness for layer 30 of between about 90 and 125 Angstrom.

The preferred thicknesses of the depositions of layers 20, 26, 28 and 30 can be summarized as follows:

layer 20, the adhesion layer preferably comprising Ti, has a preferred thickness of between about 100 and 200 Angstrom layer 26, the first or lower layer of barrier material preferably comprising TiN, has a preferred thickness of between about 100 and 175 Angstrom layer 28, the center layer of the compound barrier layer preferably comprising Ti, has a preferred thickness of between about 10 and 50 Angstrom layer 30, the second or upper barrier layer of barrier material preferably comprising TiN, has a preferred thickness of between about 90 and 125 Angstrom, the total preferred thickness for the layer of barrier material Ti/TiN is, in accordance with the above indicated values of preferred thickness for layers 26, 28 and 30, between about 200 and 350 Angstrom.

Figure 12:
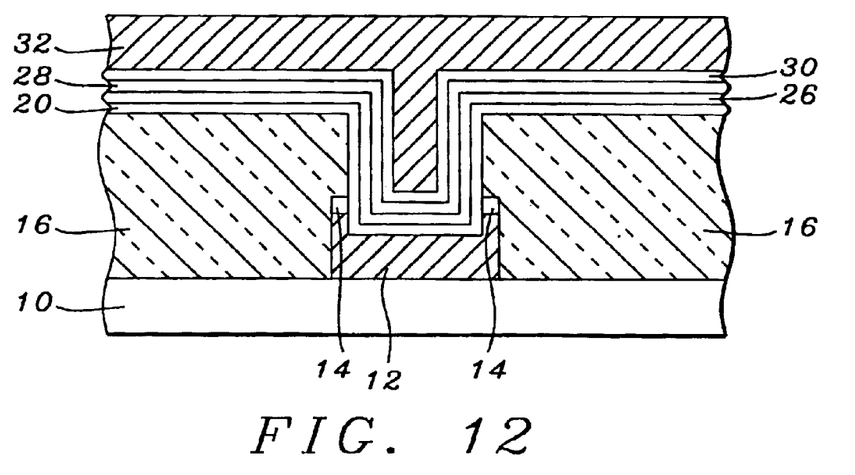
FIG. 12 shows a cross section after deposition of a layer of tungsten.
Figure 13:
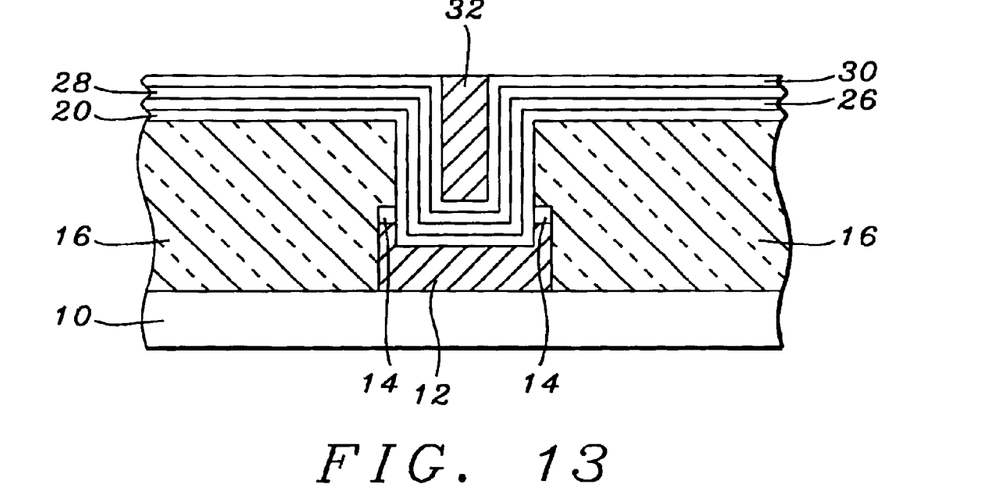
FIG. 13 shows a cross section after excess tungsten has been removed from the surface of the second layer of TiN.

The cross section shown in FIG. 12 shows that the conductive interconnect, preferably comprising tungsten, can be completed with the deposition of layer 32, preferably comprising tungsten, over the layer 30 of TiN and by, FIG. 13, removing excess tungsten from the surface of layer 30, using the layer 30 as stop layer.

Figure 14:
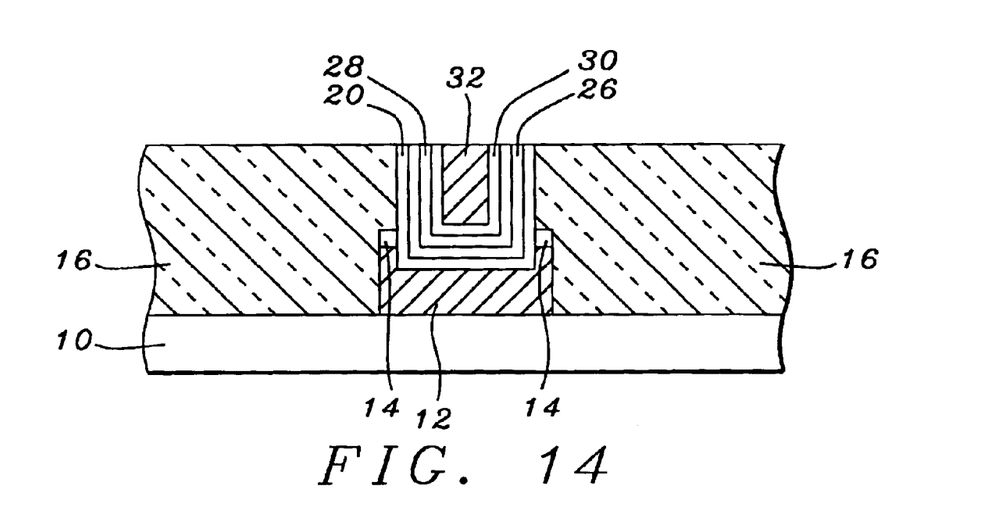
FIG. 14 shows a cross section after excess materials have been removed from the layer of dielectric.

It is preferred that excess semiconductor materials, such as layer 20 (of adhesion/glue material Ti), layer 26 (of barrier material TiN), layer 28 (of intermediate Ti) and layer 30 (of barrier material TiN) are further removed from the surface of dielectric layer 16, resulting in the cross section that his shown in FIG. 14. The preferred method for the removal of these layers as shown in the cross section of FIG. 14 is Chemical Mechanical Polishing (CMP) of the exposed surfaces.

The cross section shown in FIG. 11 specifically indicates an absence of metal protrusion and an absence of pinholes in the layers overlying the layer 20 of Ti. Improved surface protection for the layer 20 of Ti has therefore been provided by the invention resulting in an conductive interconnect 32, FIG. 13, of improved and desired deposition characteristics.

Figure 15:
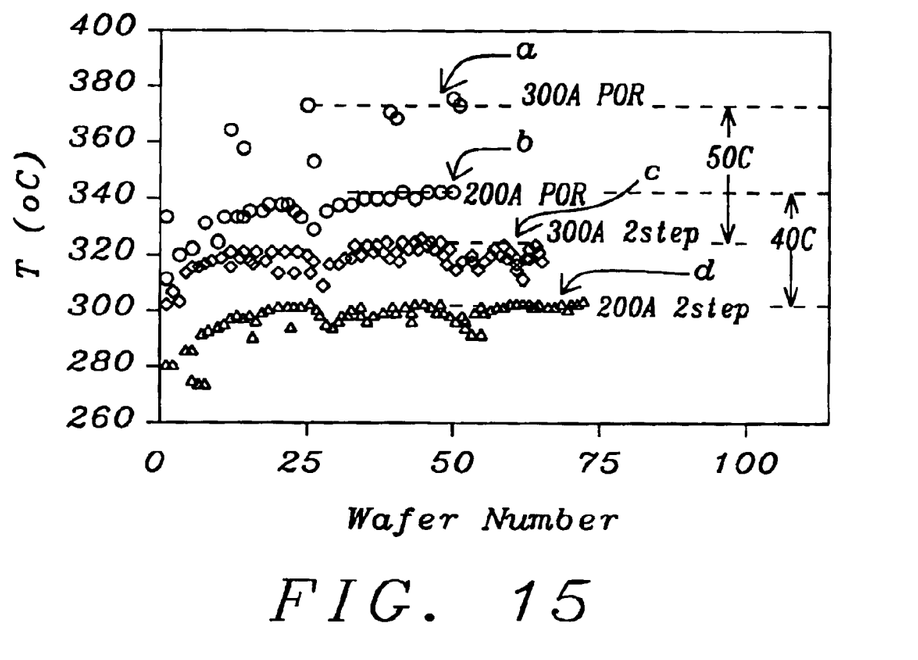
FIG. 15 shows experimental results of substrate temperature performance relating to the invention.

The effectiveness of controlling substrate temperature during the creation of glue/adhesion layers and a barrier layer is further demonstrated by the experimental results that are shown in graphic form in FIG. 15.

Along the horizontal or X-axis is shown a sequence of experimental wafers, each wafer having an identification number such as wafer #0, wafer #25, wafer #50, etc.

Along the vertical or Y-axis is shown the substrate temperature after the deposition of the glue layer of Ti and the barrier layer of TiN and prior to the deposition of the tungsten.

Four different scenarios are shown in FIG. 15, as follows:
1. Measurements highlighted as points "a" of measurements relate to the conventional, Plan-Of-Record (POR) creation of a tungsten interconnect applying a 300 Angstroms thick layer of Ti/TiN
2. Measurements highlighted as points "b" of measurements relate to the conventional, Plan-Of-Record (POR) creation of a tungsten interconnect applying a 200 Angstroms thick layer of Ti/TiN
3. Measurements highlighted as points "c" of measurements relate to the creation of a tungsten interconnect using the two-step application of the invention of the layer of barrier material comprising TiN, applying a 300 Angstroms thick layer of Ti/TiN
4. Measurements highlighted as points "d" of measurements relate to the creation of a tungsten interconnect using the two-step application of the invention of the layer of barrier material comprising TiN, applying a 200 Angstroms thick layer of Ti/TiN.

To highlight the effectiveness of the invention, measurements "a" must therefore be compared with measurements "C" and measurements "b" must be compared with measurements "d", since "a" and "c" address the creation of a 300 Angstroms thick layer of barrier material and "b" and "d" address the creation of a 200 Angstroms thick layer of barrier material.

From these measurements it can be observed that measurement points "c" (the two step deposition of the invention for the creation of a 300 Angstroms thick layer of Ti/TiN) are about 50 degrees C. lower than measurement points "a". Further, measurement points "d" (the two step deposition of the invention for the creation of a 200 Angstroms thick layer of Ti/TiN) is about 40 degrees C. lower than measurement points "b".

These latter observations confirm that the two step deposition of the invention for the creation of a barrier layer of TiN reduces the temperature of the substrate during the deposition of the layer of barrier material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A process for the creation of a metal interconnect over a layer of adhesion material and a layer of barrier material having a thickness, comprising:

providing a substrate, the substrate having been provided with at least one point of electrical contact in or over the surface thereof, a patterned layer of Anti Reflective Coating (ARC) having been deposited over at least one point of electrical contact;

depositing a layer of dielectric over the substrate, including the surface of the patterned layer of Anti Reflective Coating (ARC);

patterning and etching the layer of dielectric, creating at least one opening there-through and through said layer of ARC, exposing and further interacting with the at least one point of electrical contact;

depositing a layer of adhesion material over the layer of dielectric, including inside surfaces of the at least one opening;

depositing a layer of barrier material over the layer of adhesion material, the layer of barrier material comprising a first or lower and a second or upper layer of barrier material separated by a central layer of adhesion material;

depositing a layer of conductive material over the layer of barrier material, filling the at least one opening; and removing excess material from the layer of dielectric.

2. The method of claim 1, the at least one point of electrical contact comprising aluminum.

3. The method of claim 1, the adhesion material comprising Ti.

4. The method of claim 1, the barrier material comprising TiN.

5. The method of claim 1, the central adhesion material separating the first or lower layer of barrier material from the second or upper layer of barrier material having a thickness between about 10 and 50 Angstroms.

6. The method of claim 1, the conductive material comprising tungsten.

7. The method of claim 1, the first or lower layer of barrier material having a thickness between about 0.40 and 0.60 of a thickness of a layer of barrier material.

8. The method of claim 1, the second or upper layer of barrier material having a thickness between about 0.40 and 0.60 of a thickness of a layer of barrier material.

9. The method of claim 1, the first layer of barrier material having a thickness between about 100 and 175 Angstrom.

10. The method of claim 1, the second layer of barrier material having a thickness between about 90 and 125 Angstrom.

11. A process for the creation of a metal interconnect over a layer of glue material and a layer of barrier material having a thickness, comprising:

providing a substrate, the substrate having been provided with at least one point of electrical contact in or over the surface thereof, said at least one point of electrical contact being covered with a layer of Anti Reflective Coating (ARC), a patterned layer of dielectric having been deposited over the substrate having at least one opening there-through and through said layer of ARC being aligned with at least one point of electrical contact, said opening exposing and causing gauging of the at least one point of electrical contact;

depositing a first layer of adhesion material over the layer of dielectric, including inside surfaces of the at least one opening;

depositing a first layer of barrier material over the first layer of adhesion material to a thickness being equal to between about 0.40 and 0.60 of a thickness of a layer of barrier material;

depositing a second layer of adhesion material over the first layer of barrier material;

depositing a second layer of barrier material over the second layer of adhesion material to a thickness being equal to between about 0.40 and 0.60 of a thickness of a layer of barrier material;

depositing a layer of conductive material over the second layer of barrier material, filling the at least one opening; and removing excess material from the surface of the layer of dielectric.

12. The method of claim 11, the at least one point of electrical contact comprising aluminum.

13. The method of claim 11, the first and second layer of adhesion material comprising Ti.

14. The method of claim 11, the first and second layer of barrier material comprising TiN.

15. The method of claim 11, the second layer of adhesion material being deposited to a thickness between about 10 and 50 Angstroms.

16. The method of claim 11, the conductive material comprising tungsten.

17. The method of claim 11, the thickness of the layer of barrier material being between about 200 and 350 Angstrom.

18. The method of claim 11, the thickness of the first layer of barrier material being between about 100 and 175 Angstrom.

19. The method of claim 11, the thickness of the second layer of barrier material being between about 90 and 125 Angstrom.

20. A process for the creation of a metal interconnect over a layer of glue material and a layer of barrier material having a thickness, comprising:

providing a substrate, the substrate having been provided with at least one point of electrical contact in or over the surface thereof, said at least one point of electrical contact being covered with a layer of Anti Reflective Coating, at least one opening having been created through a layer of dielectric deposited over the substrate aligned with said at least one point of electrical contact, said at least one opening further penetrating the layer of ARC, exposing and gauging the at least one point of electrical contact;

depositing a first layer of Ti over the layer of dielectric, including inside surfaces of the at least one opening;

depositing a first layer of TiN over the first layer of adhesion material to a thickness being equal to between about 0.40 and 0.60 of a thickness of a layer of barrier material;

depositing a second layer of Ti material over the first layer of barrier material;

depositing a second layer of TiN over the second layer of adhesion material to a thickness being equal to between about 0.40 and 0.60 of a thickness of a layer of barrier material;

depositing a layer of conductive material over the second layer of barrier material, filling the at least one opening; and removing excess material from the surface of the layer of dielectric.

21. The method of claim 20, the at least one point of electrical contact comprising aluminum.

22. The method of claim 20, the second layer of adhesion material being deposited to a thickness between about 10 and 50 Angstroms.

23. The method of claim 20, the conductive material comprising tungsten.

24. The method of claim 20, the thickness of a layer of barrier material being between about 200 and 350 Angstrom.

25. The method of claim 20, the thickness of the first layer of Ti being between about 100 and 200 Angstrom.

26. The method of claim 20, the thickness of the first layer of TiN being between about 100 and 175 Angstrom.

27. The method of claim 20, the thickness of the second layer of TiN being between about 90 and 125 Angstrom.

28. A metal interconnect over a layer of adhesion material and a layer of barrier material having a thickness, comprising:

a substrate, the substrate having been provided with at least one point of electrical contact in or over the surface thereof, a layer of ARC having been provided over the at least one point of electrical contact, at least one opening having been created through a layer of dielectric aligned with the at least one point of electrical contact, said at least one opening penetrating the layer of ARC exposing and gauging the at least one point of electrical contact;

a layer of adhesion material over inside surfaces of the at least one opening;

a layer of barrier material over the layer of adhesion material, the layer of barrier material comprising a first or lower layer of barrier material and a second or upper layer of barrier material separated by a central layer of adhesion material; and a layer of conductive material over the layer of barrier material, filling the at least one opening.

29. The metal interconnect of claim 28, the at least one point of electrical contact comprising aluminum.

30. The metal interconnect of claim 28, the adhesion material comprising Ti.

31. The metal interconnect of claim 28, the barrier material comprising TiN.

32. The metal interconnect of claim 28, the adhesion material separating the first or lower layer of barrier material from the second or upper layer of barrier material having a thickness between about 10 and 100 Angstroms.

33. The metal interconnect of claim 28, the conductive material comprising tungsten.

34. The metal interconnect of claim 28, the first or lower layer of barrier material having a thickness being equal to between about 0.40 and 0.60 of the thickness of the layer of barrier material.

35. The metal interconnect of claim 28, the second or upper layer of barrier material having a thickness being equal to between about 0.40 and 0.60 of the thickness of the layer of barrier material.

36. A tungsten interconnect over a layer of glue material and a layer of barrier material having a thickness, comprising:

a substrate, the substrate having been provided with at least one point of electrical contact in or over the surface thereof, a patterned layer of ARC having been provided over the at least one point of electrical contact, at least one opening aligned with the at least one point of electrical contact having been created through a layer of dielectric deposited over the substrate, said at least one opening penetrating said patterned layer of ARC, exposing and gauging said patterned at least one point of electrical contact;

a first layer of Ti deposited over sidewalls of the at least one opening;

a first layer of deposited TiN over the first layer of Ti to a thickness being equal to between about 0.40 and 0.60 of a thickness of a layer of barrier material;

a second layer of Ti deposited over the first layer of TiN;

a second layer of TiN deposited over the second layer of Ti to a thickness being equal to between about 0.40 and 0.60 of a thickness of a layer of barrier material; and a layer of tungsten deposited over the second layer of TiN, filling the at least one opening.

37. The tungsten interconnect of claim 36, the at least one point of electrical contact comprising aluminum.

38. The tungsten interconnect of claim 36, the second layer of Ti having a thickness between about 10 and 50 Angstroms.

39. A glue/barrier layer interposed between a metal interconnect created though an opening is a dielectric, comprising:

a layer of adhesion material over the layer of dielectric, including inside surfaces of the opening;

a layer of barrier material over the layer of adhesion material, the layer of barrier material comprising a first or lower and a second or upper layer of barrier material separated by a central layer of adhesion material.

40. The glue/barrier layer of claim 39, the adhesion material comprising Ti.

41. The glue/barrier layer of claim 39, the barrier material comprising TiN.

42. The glue/barrier layer of claim 39, the central layer of adhesion material separating the first or lower layer of barrier material from the second or upper layer of barrier material having a thickness between about 10 and 100 Angstroms.

43. The glue/barrier layer of claim 39, the metal interconnect comprising tungsten.

44. The glue/barrier layer of claim 39, the first or lower layer of barrier material having a thickness being equal to between about 0.40 and 0.60 of a thickness of a layer of barrier material.

45. The glue/barrier layer of claim 39, the second or upper layer of barrier material having a thickness being equal to between about 0.40 and 0.60 of a thickness of a layer of barrier material.

* * * * *